United States Patent
Mitros

(10) Patent No.: US 6,770,933 B2
(45) Date of Patent: Aug. 3, 2004

(54) SINGLE POLY EEPROM WITH IMPROVED COUPLING RATIO

(75) Inventor: Jozef C. Mitros, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/316,471

(22) Filed: Dec. 11, 2002

(65) Prior Publication Data

US 2004/0113198 A1 Jun. 17, 2004

(51) Int. Cl.[7] .............................................. H01L 29/788
(52) U.S. Cl. ...................... 257/316; 438/257; 438/594
(58) Field of Search ................................ 438/257–267, 438/593–594; 257/316–321

(56) References Cited

U.S. PATENT DOCUMENTS 6,472,706 B2 * 10/2002 Widdershoven et al. .... 257/314
6,509,606 B1 * 1/2003 Merrill et al. .............. 257/321
6,558,997 B2 * 5/2003 Noro et al. ................. 438/201
6,624,026 B1 * 9/2003 Liu et al. .................... 438/264

* cited by examiner

Primary Examiner—Richard A. Booth
(74) Attorney, Agent, or Firm—Peter K. McLarty; W. James Brady, III; Frederick J. Telecky, Jr.

(57) ABSTRACT

A semiconductor device (200) comprising a semiconductor substrate (210) having a well (220) located therein and a first dielectric (250) located over the well (220). The semiconductor substrate (210) is doped with a first type dopant, and the well (220) is doped with a second type dopant opposite to that of the first type dopant. The semiconductor device (200) also comprises first and second electrodes (310, 320), wherein at least the first electrodes (310) are located over the well (220) and first dielectric (250). A second dielectric (510) may be located between the first and second electrodes (310, 320).

13 Claims, 8 Drawing Sheets

SINGLE POLY EEPROM WITH IMPROVED COUPLING RATIO

TECHNICAL FIELD OF THE INVENTION

The present invention is directed, in general, to semiconductor devices and, more specifically, to a semiconductor device having interdigitated electrodes over a well that is doped opposite to a substrate in which the well is formed.

BACKGROUND OF THE INVENTION

As is well known, an EEPROM (electrically erasable programmable read-only memory) is user-modifiable read-only memory that can be erased and reprogrammed repeatedly through the application of higher than normal electrical voltage. In general, EEPROM cells have proven to be a reliable and versatile form of nonvolatile reprogrammable memory.

FIG. 1 illustrates a conventional EEPROM device 100. The EEPROM includes a doped substrate 110 having an oxide layer 120 thereon. A polysilicon floating gate 130 is located over the oxide layer 120 and serves as both the gate of a transistor 140 and an electrode of the EEPROM. A control gate 150 is located over the floating gate 130 and separated therefrom by a dielectric layer 160.

Despite the success of EEPROM cells as a reliable and versatile form of nonvolatile reprogrammable memory, conventional EEPROM devices have their drawbacks. For example, the additional process steps required to form the second polysilicon or other conductive material layer comprising the control gate (150) add significant cost and time in fabricating the devices. Moreover, additional production costs are incurred when the process for manufacturing the EEPROMs can not be easily integrated with existing processes. Faced with ever increasing demands for smaller devices, higher yields at lower cost, and reduced production times, these additional processing steps are undesirable.

Previous attempts to alleviate these disadvantages included forming coplanar floating and control gates (130, 150) such that both gates could be formed in a single deposition step of the manufacturing process. However, while the resulting structure required fewer processing steps, these "single poly" EEPROM devices consumed large areas of the manufacturing wafer or die on which they were formed. This significantly increased area requirements and, therefore, limited the number of EEPROM devices fabricated on each die and increased the cost thereof. Thus, in addition to integration issues, EEPROM designers also face ever-increasing demands to decrease EEPROM surface area requirements.

Yet another issue that must be considered in addressing EEPROM manufacturing integration issues and decreasing EEPROM surface area requirements is maintaining an adequate coupling ratio. The coupling ratio ($C_r$) is given by the equation:

$$C_r = C_{cg\_fg}/(C_{cg\_gf} + C_{fg\_sub}) \quad (1)$$

where $C_{cg\_fg}$ is the capacitance formed by the control gate of the EEPROM cell and the floating gate, and $C_{fg\_sub}$ is the capacitance formed by the floating gate and the substrate thereunder.

The coupling ratio $C_r$ may also be given by the equation:

$$C_r = V_{fg}/V_{cg} \quad (2)$$

where $V_{fg}$ is the operating voltage of the floating gate and $V_{cg}$ is the operating voltage of the control gate. The operating voltage required at the control gate $V_{cg}$ to obtain the desired floating gate voltage is also known as the programming and/or erasure voltage. Typically, EEPROMs are designed to have a predetermined floating gate operating voltage $V_{fg}$. However, the voltage on the control gate $V_{cg}$ depends on the coupling ratio $C_r$ of the EEPROM device. It is highly desirable to keep the $V_{cg}$ as low as possible to achieve robust performance and to keep the overall voltage requirements for the device as low as possible.

However, in view of Equation (2), an excessively small coupling ratio $C_r$ arising from decreased size or simplified integration requires an increased control gate voltage $V_{cg}$. Moreover, in view of Equation (1), any excessive capacitance of $C_{fg\_sub}$ decreases the coupling ratio $C_r$ such that, again, an increased control gate voltage $V_{cg}$ is required in order to maintain the preferred floating gate voltage $V_{fg}$. Unfortunately, past attempts to simplify EEPROM manufacturing integration with CMOS integration, or to decrease surface area required of individual EEPROM cells, have exhibited a substantial $C_{fg\_sub}$, that disadvantageously decreased the coupling ratio $C_r$ and increased control gate voltage $V_{cg}$ requirements, which as discussed above is a less than desirable design choice.

Accordingly, what is needed in the art is a semiconductor device that does not suffer from the deficiencies found in the prior art.

SUMMARY OF THE INVENTION

To address the above-discussed deficiencies of the prior art, the present invention provides a semiconductor device comprising a semiconductor substrate having a well located therein and a first dielectric located over the well. The semiconductor substrate is doped with a first type dopant, and the well is doped with a second type dopant opposite to that of the first type dopant. The semiconductor device also comprises interdigitated first and second electrodes, wherein at least the first electrodes are located over the well and first dielectric. A second dielectric may be located between the first and second electrodes.

In another embodiment, the present invention provides an integrated circuit device comprising a transistor formed at least partially within a semiconductor substrate, a memory cell, and interconnects connecting the transistor and memory cell to form an integrated circuit. The semiconductor substrate is doped with a first type dopant. The memory cell includes a well located in the semiconductor substrate and doped with a second type dopant opposite to that of the first type dopant. A dielectric is located over the semiconductor substrate, and a floating gate is located over the dielectric and the well, wherein the floating gate is configured to form a series capacitance between the floating gate and the semiconductor substrate. This embodiment further includes a control gate that is located over the dielectric and that is substantially coplanar with and laterally offset from the floating gate, wherein the control gate is configured to form a capacitance between the control gate and the floating gate.

In yet another embodiment the present invention provides a method of manufacturing a semiconductor device, the method comprising locating a well in a semiconductor substrate doped with a first type dopant, wherein the well is doped with a second type dopant opposite to that of the first type dopant. The method also comprises locating a first dielectric over the well, forming interdigitated first and second electrodes, and positioning a second dielectric between the first and second electrodes. When forming the interdigitated first and second electrodes, at least the first electrodes are formed over the dielectric and the well.

The foregoing has outlined features of the present invention such that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the present invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
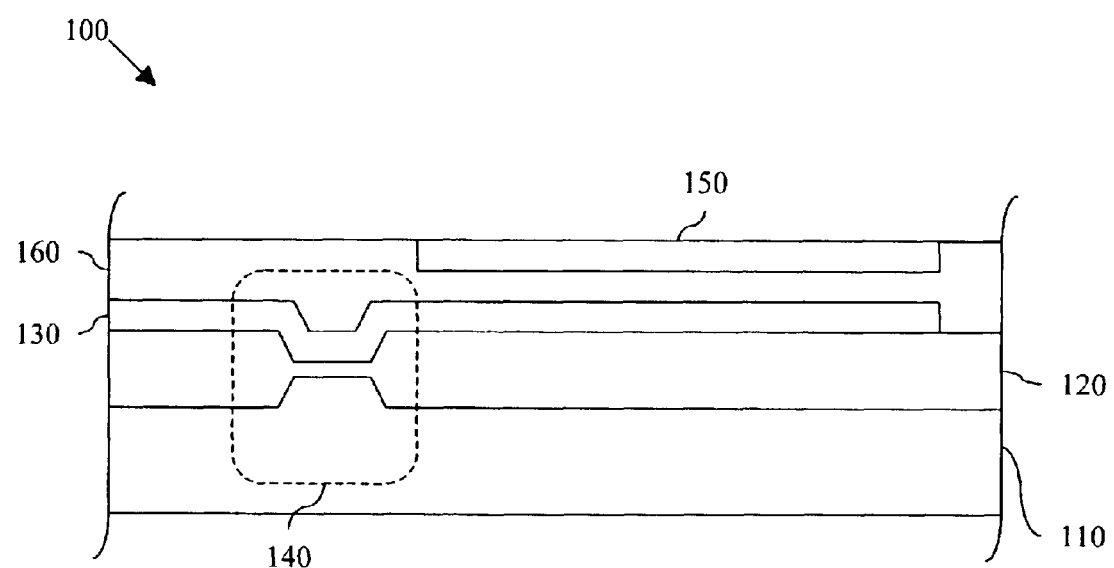
FIG. 1 illustrates a conventional EEPROM device.
Figure 2:
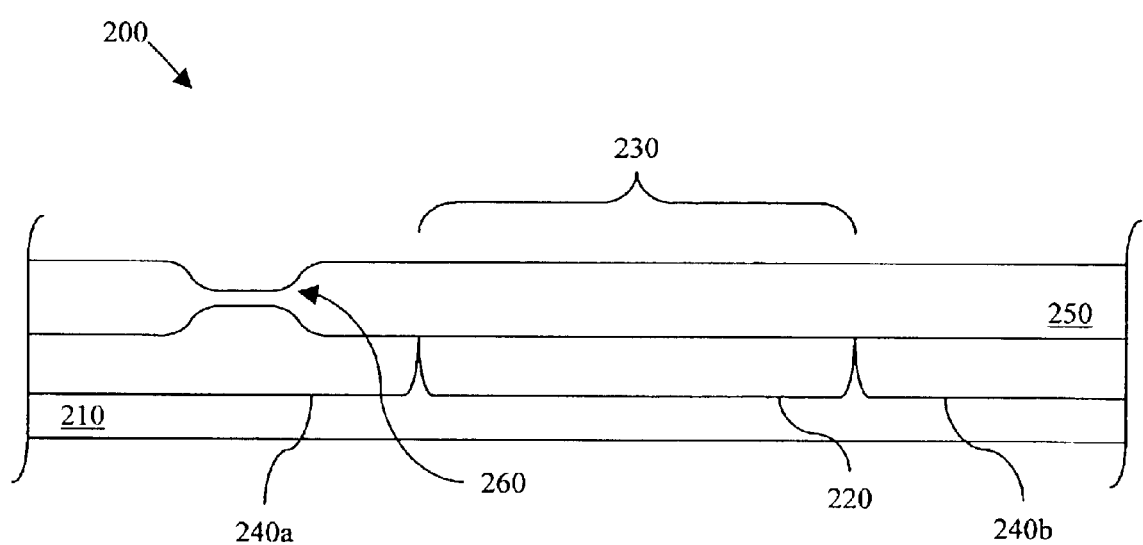
FIG. 2 illustrates a section view of an embodiment of a semiconductor device in an early stage of manufacture according to the principles of the present invention.

Referring to FIG. 2, illustrated is a section view of an embodiment of a semiconductor device 200 in an initial stage of manufacture according to the principles of the present invention. The method of manufacturing the semiconductor device 200 initiates with the provision of a semiconductor substrate 210. The semiconductor substrate 210 may comprise a silicon having a p-type or n-type conductivity. In one embodiment, the semiconductor substrate 210 may have a 4-degree-off orientation or a <100> $C_z$ crystal structure. The semiconductor substrate 210 may also be a monolithic substrate (p-type or n-type doped) or may have a conventional epi layer located thereon. The semiconductor substrate 210 may also have a substrate resistivity ranging between about 5 and about 50 ohms-cm, and preferably between about 5 and about 15 ohms-cm. In one embodiment, the substrate resistivity of the semiconductor substrate 210 may be about 7 ohms-cm.

As shown in FIG. 2, a well 220 is formed in the semiconductor substrate 210 in a memory cell region 230. The memory cell region 230 is the region of the semiconductor substrate 210 in which a memory cell will be formed according to the principles of the present invention. The well 220 is defined by a region within the semiconductor substrate 210 that has a dopant type opposite the dopant type of the semiconductor substrate 210. For example, if the semiconductor substrate 210 is doped with a first type dopant (e.g., p-type dopant), the well 220 may be doped with a second type dopant (e.g, n-type dopant). However, the principles of the present invention do not limit the semiconductor substrate 210 and well 220 to specific dopant types, and the doping schemes as set forth above may, of course, be reversed.

In one embodiment, a conventional complimentary metal oxide semiconductor (CMOS) doping scheme having alternating regions of p-type and n-type doping may be utilized, such that the well 220 may merely be one of the n-type or p-type doped regions in the conventional CMOS doping scheme. This aspect of the present invention allows for easy integration into existing CMOS, EEPROM or other semiconductor device fabrication processes. In such embodiments, adjacent wells 240 may have a dopant type opposite to that of the dopant type of the well 220, as shown in FIG. 2. For example, the well 220 may be doped with an n-type dopant, and the adjacent wells 240a, 240b may be doped with a p-type dopant, such that junctions are formed between the well 220 and each adjacent well 240a, 240b.

The well 220 may be formed by implanting the appropriate dopants through a patterned photoresist (not shown) In a preferred embodiment, an n-type dopant, such a phosphorous, is implanted at a concentration ranging between about 1.0E12 atoms/cm$^2$ and about 1.0E13 atoms/cm$^2$ and at an implant energy ranging between about 50 keV and about 1000 keV to form the well 220. In a more specific embodiment, the n-type dopant concentration may be about 1.0E13 atoms/cm$^2$ and the implant energy may be about 900 keV.

As shown in FIG. 2, a first dielectric 250 is conventionally formed over the semiconductor substrate 210. The first dielectric 250 may be a field oxide comprising silicon dioxide or compounds thereof, and may have a thickness ranging between about 400 nm and about 700 nm.

A thinned section 260 of the first dielectric 250 is also illustrated in FIG. 2 and can serve as the location of a conventionally formed transistor that will be formed over the adjacent well 240a, as described below. For example, the thinned section 260 may represent the location of a gate oxide layer conventionally formed between field oxide regions of a typical CMOS transistor. Those skilled in the art understand how conventional transistors are formed and may be associated with an adjacent memory structure, as discussed below. Moreover, those skilled in the art will recognize that the transistor represented herein is exemplary and not intended to be limiting to the scope of the present invention. That is, semiconductor devices constructed according to the principles of the present invention may include any conventional or future developed transistor, including buried-channel and surface-channel transistors.

Figure 3:
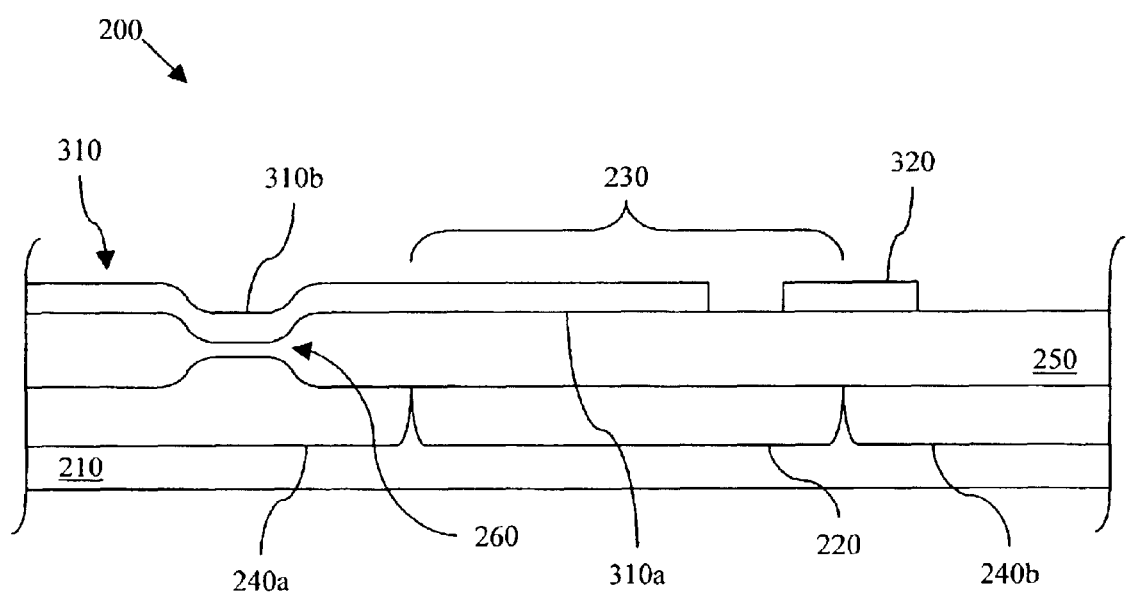
FIG. 3 illustrates a section view of the semiconductor device shown in FIG. 2 in a subsequent stage of manufacture according to the principles of the present invention.

Turning to FIG. 3, illustrated is a section view of the semiconductor device 200 shown in FIG. 2 after a first electrode 310 and second electrode 320 have been formed. The first and second electrodes 310, 320 may be formed by conventional photolithography techniques, such as by etching a blanket deposition of doped or undoped polysilicon or other conductive material through a photoresist pattern (not shown). Thus, the first and second electrodes 310, 320 may be formed in a single deposition with a single etch, instead of requiring the multiple process steps of conventional processes.

The first and second electrodes 310, 320 may have a thickness ranging between about 280 nm and about 340 nm. Moreover, the first electrode 310 follows the contour of the thinned section 260 of the first dielectric 250. Accordingly, the first electrode 310 may also function as a transistor gate in that region of the semiconductor device 200. In the embodiment illustrated in FIG. 3, the first electrode 310 has a first electrode portion 310a located over well 220 and a first electrode portion 310b located over well 240a. In such embodiments, the portion 310a may serve as a floating gate, whereas the portion 310b may serve as a transistor gate, such that a transistor to be formed with the portion 310b may be associated with a memory cell to formed with portion 310a. Also, it should be noted that in such embodiments, the second electrode 320 may serve as a control gate for the semiconductor device 200.

As discussed above, the first electrode portion 310a is formed at least substantially over the well 220, as illustrated. The addition of the well 220 between the first electrode portion 310a and the semiconductor substrate 210 provides one advantage of the present invention. More specifically, the semiconductor device 200 may have decreased surface area requirements compared to devices of the prior art while the coupling ratio $C_r$ of the semiconductor device 200 may be maintained at a nominal value as a result of the addition of the well 220.

For example, referring to Equation (1) above, $C_{fg\_sub}$ is the capacitance between the first electrode portion 310a and the semiconductor substrate 210 However, the junction of the opposite dopant types of the well 220 and the semiconductor substrate 210 adds an additional in-series capacitive element between the first electrode portion 310a and the semiconductor substrate 210. Those skilled in the art understand how junctions of opposite dopant types function as a capacitive element. Because the additional capacitive element formed by the junction of the well 220 and the semiconductor substrate 210 is in series with the capacitive element formed by the junction of the first electrode portion 310a and the well 220, the capacitance between the first electrode portion 310a and the semiconductor substrate 210 is reduced. Those skilled in the art understand that adding a capacitive element in series with another capacitive element results in a reduced net capacitance of the two capacitive elements.

Referring again to Equation (1) above, a decreased capacitance between the first electrode portion 310a and the underlying semiconductor substrate 210 ($C_{fg\_sub}$) increases the coupling ratio $C_r$. Moreover, referring again to Equation (2) above, control gate voltage ($V_{cg}$) requirements for a given floating gate voltage ($V_{fg}$) decrease as $C_r$ increases. Accordingly, the interposition of the well 220 between the first electrode portion 310a and the semiconductor substrate 210 decreases the $V_{cg}$ required for nominal operation of the semiconductor device 200. Moreover, as discussed above, one obstacle in decreasing the surface area of an EEPROM or other semiconductor device is a corresponding decrease in the coupling ratio $C_r$. However, a semiconductor device of the present invention (such as the semiconductor device 200) may experience a decrease in surface area compared to those of the prior art, such as by employing features discussed below, but the well 220 formed between the first electrode portion 310a and the semiconductor substrate 210 may operate to maintain an adequate coupling ratio. Accordingly, desired programming/erasure or control gate voltage ($V_{cg}$) requirements may also be maintained despite the decrease in total device surface area.

Figure 4:
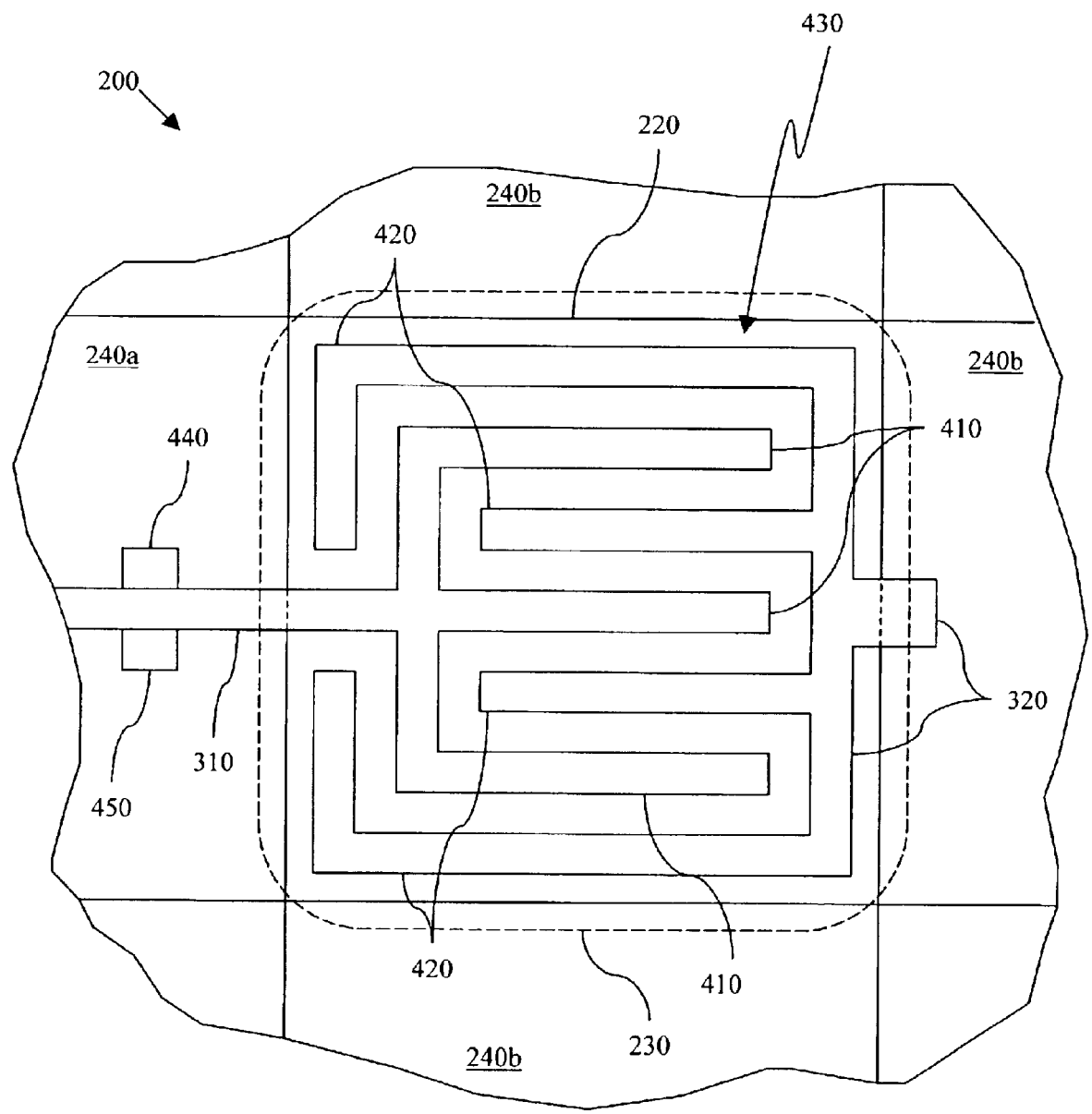
FIG. 4 illustrates a top view of the semiconductor device shown in FIG. 3.

Turning now to FIG. 4 with continued reference to FIGS. 2 and 3, there is illustrated a top view of the semiconductor device 200 as shown in FIG. 3. This top view illustrates that the first and second electrodes 310, 320 include extensions or fingers 410, 420, respectively. As shown in FIG. 4, the extensions 410, which are top views of the first electrode portion 310a, extend away from the adjacent well 240a where a transistor will be formed and into a central portion of the memory cell region 230. The extensions 420 extend into the central portion of the memory cell region 230 from an opposite direction, thereby extending between and optionally around the extensions 410. In this manner, the first and second electrodes 310, 320 and/or their respective extensions 410, 420 may be interdigitated.

The interdigitated configuration of the first and second electrodes 310, 320 (or their respective extensions 410, 420) provide another advantage of the present invention. For example, those skilled in the art will recognize that the extensions 410 and 420 may respectively function as a floating gate and a control gate of an EEPROM device. The interdigitated electrode configuration of the present invention provides greater capacitance between the floating gate and control gate (per unit area) relative to conventional EEPROM devices merely having rectangular electrodes (plates) adjacent one another. Consequently, semiconductor devices of the present invention (such as the semiconductor device 200) may exhibit a capacitance between the floating gate and control gate that is substantially equivalent to that exhibited by conventional semiconductor devices even though the devices of the present invention may have a significantly smaller surface area than those of the prior art. Accordingly, the coupling ratio $C_r$ of the smaller semiconductor devices of the present invention may be maintained despite the decrease in total device surface area compared to conventional devices, due to the greater capacitance per unit area attainable by the interdigitated electrode configuration of the present invention.

That is, referring again to Equation (1) above, an increased capacitance between the floating gate and control gate ($C_{cg\_fg}$) increases the coupling ratio $C_r$. Moreover, referring again to Equation (2) above, control gate voltage ($V_{cg}$) requirements for a given floating gate voltage ($V_{fg}$) decrease as $C_r$ increases. Accordingly, the interdigitated configuration of the extensions 410, 420 may decrease the control gate voltage $V_{cg}$ required for nominal operation of the semiconductor device 200, or may maintain a desired control gate voltage $V_{cg}$ even though the overall size of the semiconductor device 200 is smaller than conventional devices.

The formation of the first and second electrodes 310, 320 substantially completes one embodiment of a memory cell 430 in the memory cell region 230 according to the principles of the present invention. However, other embodiments of the present invention include additional features. For example, FIG. 4 also illustrates a representation of a conventional source 440 and drain 450 formed in the adjacent well 240a on opposing sides of the first electrode 310. A channel or active region (hidden from view by the first electrode 310 in FIG. 4) is thus defined between the source 440 and drain 450.

Figure 5:
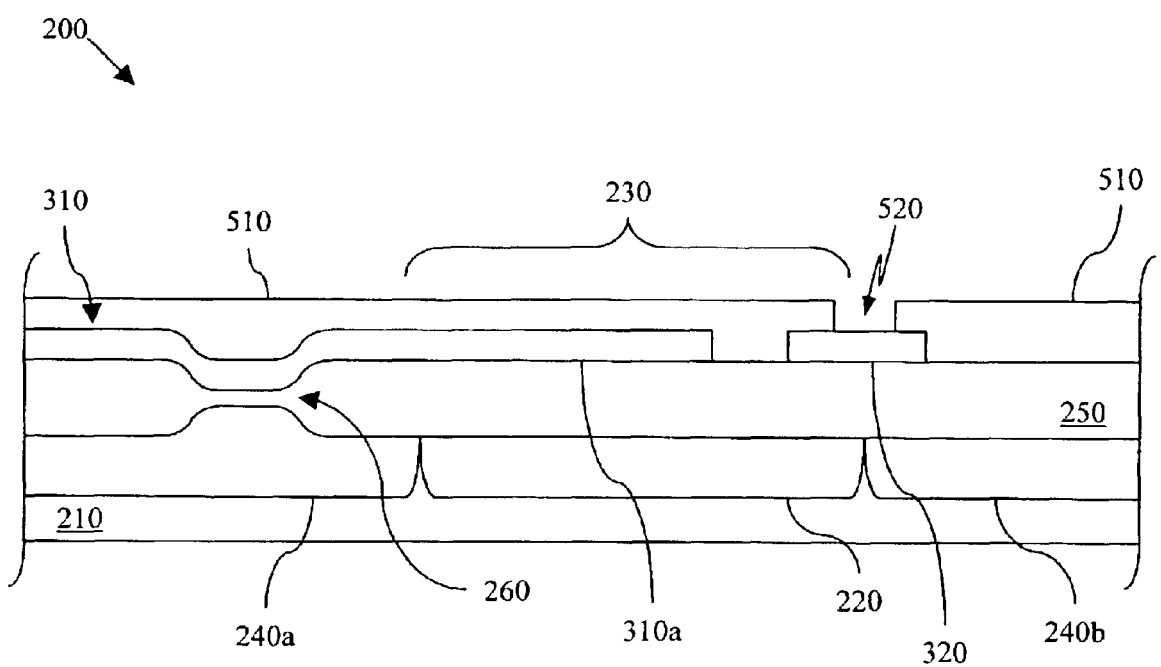
FIG. 5 illustrates a section view of the semiconductor device shown in FIGS. 3 and 4 in a subsequent stage of manufacture according to the principles of the present invention.

Turning to FIG. 5, illustrated is a section view of the partially completed semiconductor device 200 shown in FIGS. 3 and 4 after a second dielectric 510 has been formed over the first dielectric 250 and between the first and second electrodes 310, 320 and their respective interdigitated extensions 410, 420. The second dielectric 510 may be formed by deposition or other conventional means. The second dielectric 510 may comprise a blanket deposit of silicon dioxide or other conventional dielectric materials, and may have a thickness ranging between about 200 nm and about 800 nm. Moreover, as shown in FIG. 5, the second dielectric 510 may be conventionally etched, such as with a patterned photoresist (not shown), to form a first opening 520 exposing a portion of the second electrode 320. The purpose of the opening 520 will become evident in the discussion below.

Figure 6:
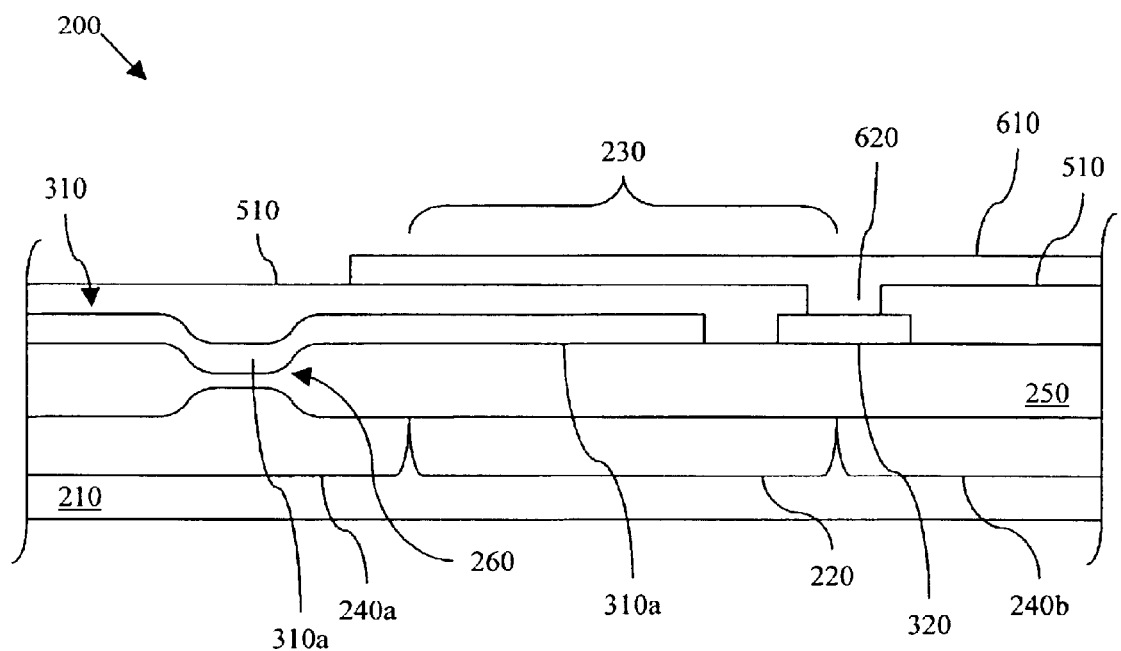
FIG. 6 illustrates a section view of the semiconductor device shown in FIG. 5 in a subsequent stage of manufacture according to the principles of the present invention.

Turning to FIG. 6, illustrated is a section view of the partially completed semiconductor device 200 shown in FIG. 5 after a third electrode 610 has been conventionally formed over the second dielectric 510 and in the opening 520. The third electrode 610 preferably comprises a conductive metallic material, such as copper, aluminum, tungsten, titanium or alloys thereof, and may have a thickness similar to that of the first and second electrodes 310, 320. Preferably, the third electrode 610 may be substantially or completely void of polysilicon.

The third electrode 610 may be formed using conventional photolithography techniques, such as by depositing a blanket layer of metallic material over the second dielectric 510 and in the opening 520 (FIG. 5) and subsequently etching the metallic material through a patterned photoresist (not shown). As shown in FIG. 6, the third electrode 610 is in electrical contact with the second electrode 320 via the metallic material filling the opening 520 and forming a support 620.

The addition of the third electrode 610 overlying the first electrode 310 provides yet another advantage of the present invention. For example, referring again to Equation (1) above, $C_{cg\_fg}$ is the capacitance between first electrode portion 310a and the second electrode 320. However, the third electrode 610 is also separated from the first electrode portion 310a by the second dielectric 510, and is electrically connected to the second electrode 320 at support 620. Accordingly, the third electrode 610 may be considered a control gate electrode that adds an additional capacitive element to $C_{cg\_fg}$. Because the third electrode 610 is electrically coupled to the second electrode 320, the additional capacitive element formed by the third electrode 610 and the first electrode portion 310a is in parallel with the capacitive element formed by the first electrode portion 310a and the second electrode 320. Accordingly, the capacitance between the first electrode portion 310a and the combination of the second electrode 320 and third electrode 610 is increased (per unit area). Those skilled in the art understand that adding a capacitive element in parallel with another capacitive element results in an increased net capacitance of the two capacitive elements. Consequently, semiconductor devices of the present invention (such as the semiconductor device 200) may exhibit a capacitance between the first electrode portion 310a and the combination of the second electrode 320 and third electrode 610 that is substantially equivalent to that exhibited by typical control and floating gates of a conventional semiconductor device even though the devices of the present invention may have a significantly smaller surface area than those of the prior art. Accordingly, the coupling ratio $C_r$ of the smaller semiconductor devices of the present invention may be maintained despite the decrease in total device surface area as compared to conventional devices, due to the greater capacitance per unit area attainable by the addition of the third electrode 610 electrically coupled to the second electrode 320.

Referring again to Equation (1) above, an increased capacitance between the floating gate and the control gate ($C_{cg\_fg}$) increases the coupling ratio $C_r$. Moreover, referring again to Equation (2) above, control gate voltage ($V_{cg}$) requirement for a given floating gate voltage ($V_{fg}$) decreases as $C_r$ increases. Accordingly, the addition of the third electrode 610 over the first electrode portion 310a and electrically connected to the second electrode 320 decreases the $V_{cg}$ required for nominal operation of the semiconductor device 200. Of course, those skilled in the art will recognize that while the third electrode 610 can further decrease the $V_{cg}$ required for nominal operation of the semiconductor device 200, the third electrode 610 is optional. That is, embodiments of the semiconductor device 200 not including the third electrode 610 are still advantageous over conventional devices.

Figure 7:
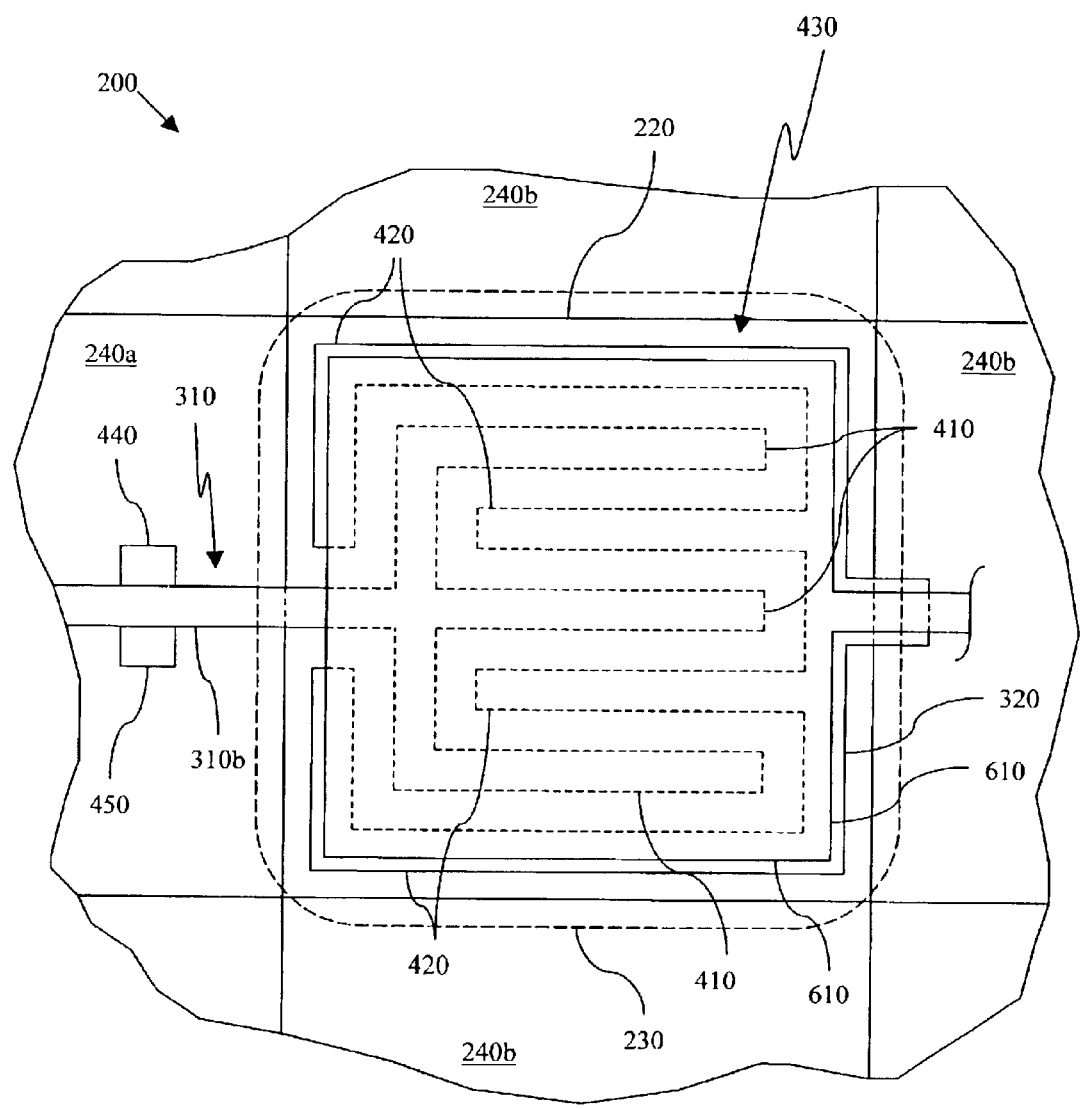
FIG. 7 illustrates a top view of the semiconductor device shown in FIG. 6.

Turning briefly to FIG. 7, illustrated is a top view of the semiconductor device 200 shown in FIG. 6. As shown in FIG. 7, the third electrode 610 covers a substantial portion of the first electrode portion 310a within the memory cell region 230. However, those skilled in the art will recognize that complete coverage of the first electrode 310 is not necessary according to the principles of the present invention. That is, according to Equation (1) above, almost any coverage of the first electrode 310 by the third electrode 610 will advantageously increase the capacitance formed between the first and third electrodes 310, 610 per unit area. Accordingly, a third electrode 610 having a shape different than that shown in FIG. 7, and therefore covering a different portion of the first electrode 310, is within the scope of the present invention.

Figure 8:
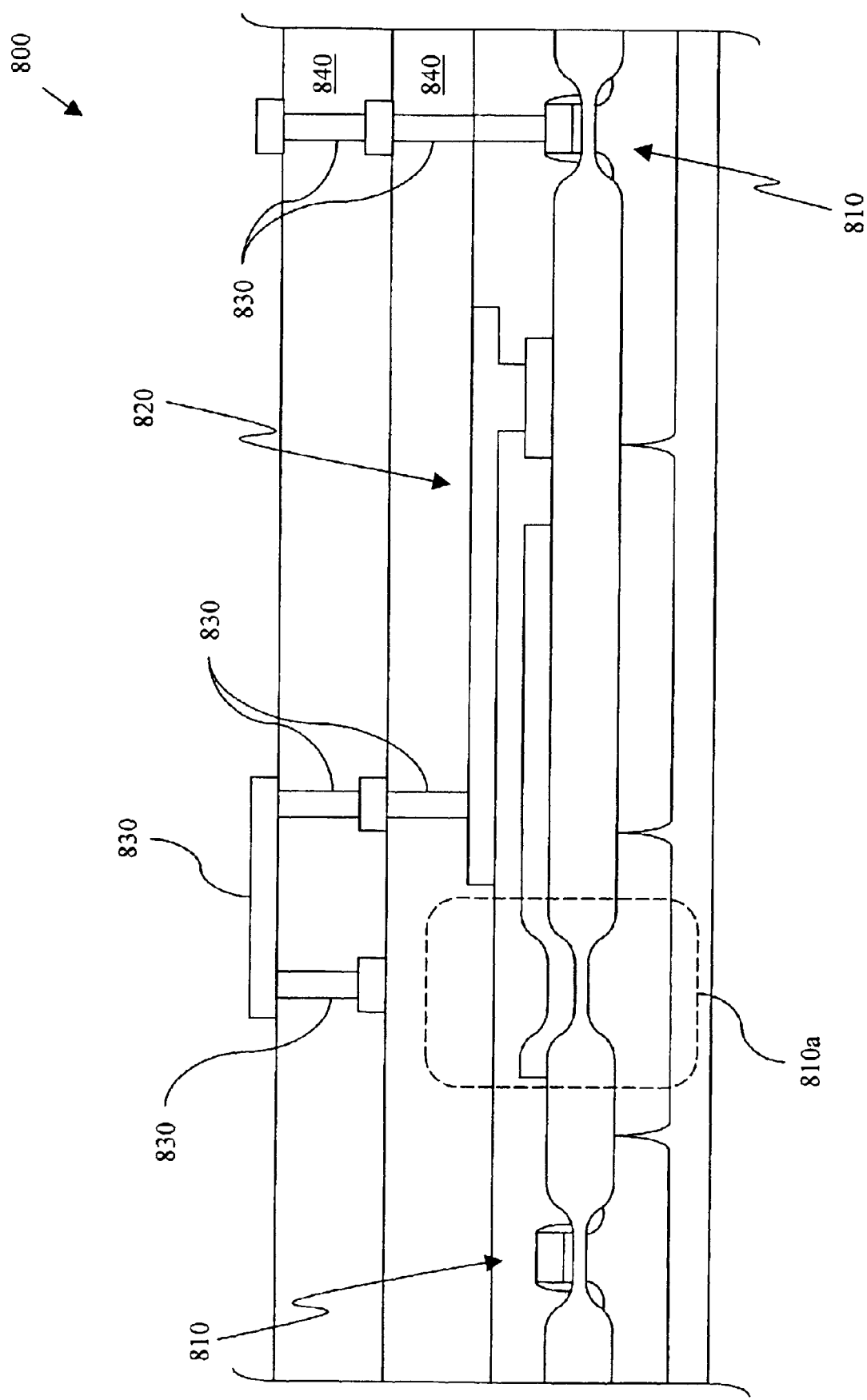
FIG. 8 illustrates a section view of an embodiment of an intergrated circuit device constructed according to the present invention.

The semiconductor device 200 shown in FIGS. 2–7 being substantially complete, we turn now to FIG. 8, which illustrates a section view of one embodiment of an integrated circuit device 800 which may be one environment within which a semiconductor device constructed according to the present invention, such as the semiconductor device 200, may be incorporated. The integrated circuit device 800 may include active devices 810, such as transistors used to form CMOS devices, bipolar devices, or other types of active devices. In the particular embodiment shown in FIG. 8, the integrated circuit device 800 includes a transistor 810a that may comprise features at least similar to the exemplary source 410, drain 420 and first electrode portion 310b shown in FIGS. 6 and 7. The integrated circuit device 800 may also include passive devices (not shown), such as capacitors, resistors and inductors. Those skilled in the art are familiar with these various types of devices and their manufacture.

In the particular embodiment illustrated in FIG. 8, the integrated circuit device 800 also includes a memory cell 820, which may be at least similar to the memory cell 430 shown in FIG. 7. The integrated circuit device 800 also includes conventional interconnect structures 830 located within one or more dielectric layers 840 to interconnect the active and/or passive devices to form an operative integrated circuit.

Thus, the present invention provides an increased coupling ratio $C_r$ for an EEPROM or other semiconductor device. Alternatively, the present invention may provide an EEPROM or other semiconductor device having a smaller surface area than those of the prior art while maintaining an adequate coupling ratio $C_r$ and, thus, maintaining a desired programming, erasure or control gate voltage ($V_{cg}$). The coupling ratio $C_r$ may be individually maintained by each of three features described above or any combination thereof. That is, an adequate $C_r$ may be maintained by interdigitating the first and second electrodes 310, 320 (via their respective extensions 410, 420), which increases the capacitance formed thereby ($C_{cg\_fg}$) per unit area.

The $C_r$ may also be maintained by interposing the well 220 between the first electrode portion 310a and the semiconductor substrate 210, which adds an additional capacitive element in series with the capacitive element conventionally formed by the floating gate and the semiconductor substrate 210. Such an additional capacitive element decreases the capacitance formed by the first electrode portion 310a and the semiconductor substrate 210 ($C_{fg\_sub}$) per unit area which, according to Equation (1) above, increases $C_r$.

The $C_r$ may also be maintained by adding the third electrode 610 over the first electrode portion 310a, wherein the third electrode 610 is electrically connected to the second electrode 320, thereby adding a capacitive element in parallel to the capacitive element formed by the first electrode portion 310a and the second electrode 320. Such an additional capacitive element increases the capacitance formed by the floating gate and the control gate ($C_{cg\_fg}$) per unit area which, according to Equation (1) above, increases $C_r$.

As discussed above, conventional EEPROM devices disadvantageously exhibit a coupling ratio $C_r$ between about 0.5 and 0.7. However, embodiments of an EEPROM or other semiconductor device constructed according to the principles of the present invention, such as the semiconductor device 200 shown in FIGS. 2–7, may exhibit a coupling ratio $C_r$ ranging between about 0.65 and about 0.75.

Moreover, the coupling ratio $C_r$ may be maintained without increasing the number of process steps required to manufacture an EEPROM or other semiconductor device according to the present invention, and the modified process steps may be implemented into existing manufacturing processes with ease. For example, the interdigitated electrodes (410, 420) of the present invention may be formed in the same process steps in which the rectangular plate electrodes were formed for conventional EEPROM devices, and the well (220) located under the first electrode portion 310a of the present invention may be formed in the same process steps typically required of conventional doping schemes.

In addition to the increased performance discussed above, an EEPROM or other semiconductor device constructed according to the principles of the present invention may be embodied in a small package compared to conventional EEPROM devices. For example, conventional EEPROM devices typically required as much as 200 square micrometers of wafer or die surface area. However, EEPROM and other semiconductor devices of the present invention may require a die surface area of only about 10 to about 100 micrometers. In some embodiments, this surface area may range between about 10 and about 50 micrometers, while in other embodiments the surface area may range between only about 10 and about 20 micrometers. Moreover, as discussed above, such a surface area reduction may be achieved without decreasing the coupling ratio $C_r$ and, correspondingly, increasing the programming/erasure or control gate voltage ($V_{cg}$). Of course, those skilled in the art will recognize that the present invention is not limited to EEPROM and other semiconductor devices having a die specific surface area.

Although the present invention has been described in detail, those skilled in the art should understand that they can make various changes, substitutions and alterations herein without departing from the spirit and scope of the invention.

What is claimed is:

1. A semiconductor device, comprising:
    a semiconductor substrate doped with a first type dopant and having a well located therein doped with a second type dopant opposite to that of said first type dopant;
    a first dielectric located over said well;
    interdigitated first and second electrodes, at least said first electrodes located over said first dielectric and said well;
    a second dielectric located between said first and second electrodes;
    a third dielectric located over said first and second electrodes and further comprising a third electrode electrically coupled to said second electrode and separated from said first electrode by said third dielectric.

2. The semiconductor device as recited in claim 1 wherein a coupling ratio of said semiconductor device ranges between about 0.65 and about 0.75 and a total surface area of said semiconductor device ranges between about 10 and 100 micrometers.

3. The semiconductor device recited in claim 1 wherein said first type dopant is a p-type dopant and said second type dopant is an n-type dopant.

4. The semiconductor device as recited in claim 1 wherein said third electrode comprises metal.

5. The semiconductor device as recited in claim 1 wherein said well is a first well and said semiconductor substrate further includes a second well forming a junction with said first well.

6. The semiconductor device as recited in claim 1 wherein said semiconductor device is a memory device and said first electrode includes a transistor gate of a transistor associated with said memory device.

7. An integrated circuit device, comprising:
    a transistor formed at least partially within a semiconductor substrate doped with a first type dopant;
    a memory cell, including:
        a well located in said semiconductor substrate and doped with a second type dopant opposite to that of said first type dopant;
        a dielectric located over said semiconductor substrate;
        a floating gate located over said dielectric and said well and configured to form a series capacitance between said floating gate and said semiconductor substrate; and
        a control gate located over said dielectric, substantially coplanar with and laterally offset from said floating gate and configured to form a capacitance between said control gate and said floating gate wherein said floating gate and said control gate are interdigitated; and
    interconnects connecting said transistor and said memory cell to form an integrated circuit.

8. The integrated circuit device as recited in claim 7 wherein a coupling ratio of said semiconductor device ranges between about 0.65 and about 0.75 and a total surface area of said semiconductor device ranges between about 10 and about 100 micrometers.

9. The integrated circuit device as recited in claim 7 wherein said dielectric is a first dielectric and further comprising a second dielectric between said floating gate and said control gate.

10. The integrated circuit device as recited in claim 7 wherein said first type dopant is a p-type dopant and said second type dopant is an n-type dopant.

11. The integrated circuit device as recited in claim 7 wherein said dielectric is a first dielectric and further comprising a control gate electrode and a second dielectric, said control gate electrode electrically coupled to said control gate and separated from said floating gate by said second dielectric.

12. The integrated circuit device as recited in claim 11 wherein said control gate electrode comprises metal.

13. The integrated circuit device as recited in claim 7 wherein said well is a first well and said semiconductor substrate further includes a second well forming a junction with said first well.

* * * * *